United States Patent [19]

Ennulat

[11] 4,142,206

[45] Feb. 27, 1979

[54] PYROELECTRIC SOLID STATE IMAGER

[75] Inventor: Reinhard D. Ennulat, Alexandria, Va.

[73] Assignee: The United States of America as represented by the Secretary of the Army, Washington, D.C.

[21] Appl. No.: 808,837

[22] Filed: Jun. 22, 1977

[51] Int. Cl.² ............................................. H01I 29/45
[52] U.S. Cl. ...................................... 358/113; 250/330
[58] Field of Search ............... 358/110, 113, 199, 225; 250/330

[56] References Cited

U.S. PATENT DOCUMENTS 3,808,435  4/1974  Bate et al. ............................ 358/113

FOREIGN PATENT DOCUMENTS

1395741  5/1972  United Kingdom ....................... 358/113

Primary Examiner—Robert L. Griffin
Assistant Examiner—Edward L. Coles
Attorney, Agent, or Firm—Nathan Edelberg; Milton W. Lee; Max L. Harwell

[57] ABSTRACT

An improved solid state pyroelectric imaging system having readout of the picture elements of the pyroelectric disc in a plurality of parallel readout channels. Each picture element of a given line is sequentially connected through photoconductive switches to an amplifier and a display device.

15 Claims, 9 Drawing Figures

PYROELECTRIC SOLID STATE IMAGER

The invention described herein may be manufactured, used, and licensed by the U.S. Government for governmental purposes without the payment of any royalties thereon.

BACKGROUND OF THE INVENTION

Currently used pyroelectric imagers consist of a conventional vidicon, in which the photoconductive target is replaced by a thin, electroded pyroelectric disc. Radiation imaged on this disc is converted into heat by absorption. The resulting temperature pattern generates an equivalent charge pattern, which, in turn, is read out by an electron beam and displayed by a cathode ray tube.

The relatively high impedance of the electron beam and the capacitance of the disc determine the time constant of the signal discharge. To achieve efficient readout of the signal charge, this time constant must be shorter than the time the electron beam dwells on a picture element. This condition can be fulfilled if the relative dielectric constant is less than one hundred. Since the ratio of the pyroelectric coefficient to the dielectric constant is approximately constant for proper pyroelectrics, the large pyroelectric coefficient typical for materials of high dielectric constant cannot be exploited for pyroelectric vidicons.

The noise level of pyroelectric vidicon cameras comprises the shot noise of the electron beam, the pedestal current noise, and the preamplifier noise. Depending on design and frequency region, the total noise is proportional to the square root of the bandwidth of the video electronics or to a certain power thereof.

The prime objective of the invention is to overcome these basic limitations of the signal to noise ratio.

SUMMARY OF THE INVENTION

The solid state pyroelectric imager described in this invention allows for read out of the picture elements of the sensing layer means, or pyroelectric disc, in many parallel readout channels. Thus, for a given number of picture elements and a given frame rate, the signal to noise ratio of this new device is larger than that of the pyroelectric vidicon by a factor proportional to the square root of the number of channels. In addition, the signal level can be increased by using pyroelectric materials of high dielectric constant and high pyroelectric coefficient. Typical pyroelectric materials that may be used are triglycine sulfate or barium strontium titanate. These improvements are achieved by sequentially connecting each picture element of a given line through photoconductive switches to electronic amplification means and a display by using many independent channels of this kind.

DESCRIPTION OF INVENTION

Figure 1:
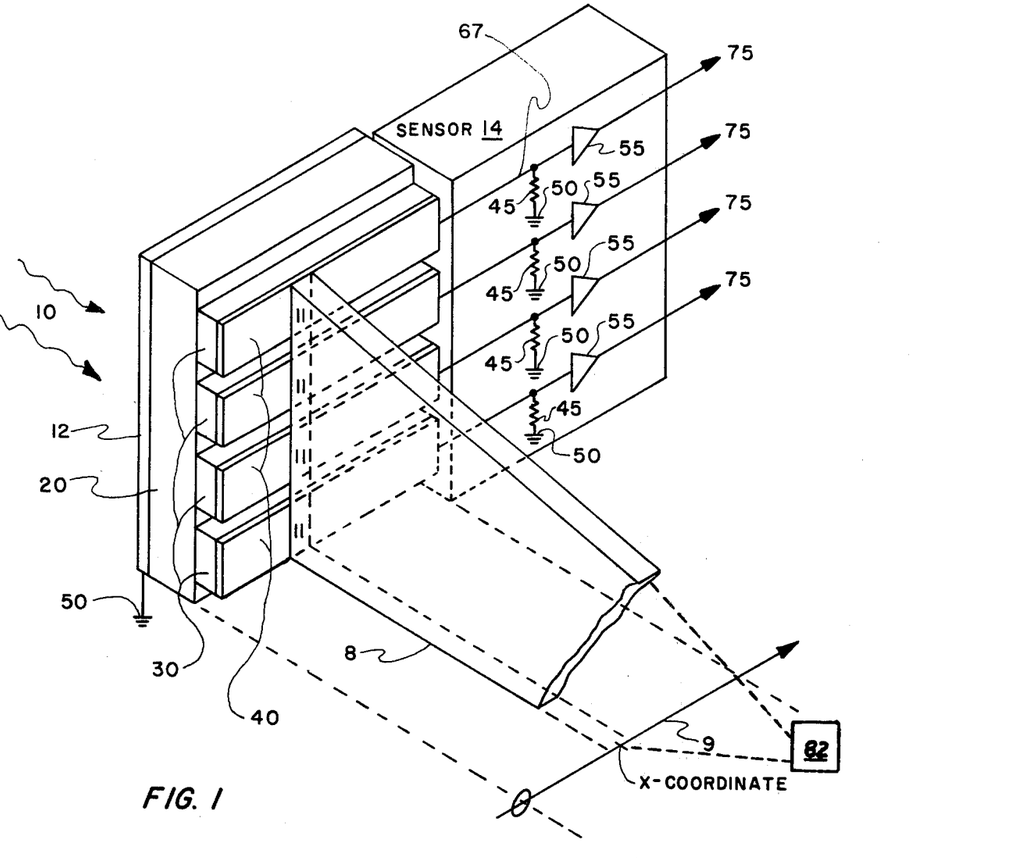
FIG. 1 shows in a schematic perspective one concept of the present invention.

FIG. 1 illustrates the principle of the present invention. Numeral 20 shows a sensing layer means, which may comprise a thin pyroelectric disc whose electric polarization is unidirectional, uniform and perpendicular to the surface. The input side of disc 20 may be covered by an infrared transmissive electrode 12 to allow the incident infrared signal radiation to be absorbed in disc 20. If disc 20 does not absorb radiation 10, electrode 12 may be covered by an absorber (not shown). The readout side of disc 20 is covered by a plurality of parallel readout channels that are read out by a readout means which is explained below. The plurality of parallel readout channels are comprised of a plurality of photoconductor switching means that include at least a plurality of parallel continuous photoconductive strips 30, that are deposited contiguous with said readout side of disc 20, and wherein each strip 30 has one of a plurality of optically transparent electrically conductive strips 40 deposited thereon. A light beam, indicated by numeral 8, from a light source and scanning means 82 is swept over strips 30 on the readout side of disc 20. Means 82 comprises a part of said readout means. The combined plurality of parallel continuous photoconductive strips 30 and plurality of optically transparent strips 40 form a plurality of parallel readout channels, or optically transparent electrically conductive readout strips on the readout side of disc 20. These plurality of parallel readout channels are electrically connected through their respective strips 40 to the inputs of an electronic amplification means having a plurality of output video electronic channels comprised of a plurality of load resistors 45 and video electronics 55, such as preamplifiers, to provide output signals in parallel output channels 75 to some visible radiator display device, represented by a linear array 43 in FIGS. 7, 8, and 9, or to either an XY matrix or charge coupled device (CCD) multiplexer of either FIG. 2 or FIG. 3 respectively. This visible radiator display device may be a plurality of visible radiators, such as light emitting diodes or lasers that are arranged in a linear array. A narrow light beam 8 from some light source and scanning means 82 addresses and sweeps out a column of picture elements, represented as numeral 11, in such a way that each photoconductive strip 30 contains only one illuminated picture element 11 at any particular instant and that the instant position of the column of picture elements is described uniquely by the X-coordinate of the coordinate system 9. Thus, the device shown in FIG. 1 allows readout of the charge that is generated by the pyroelectric disc 20 in response to the infrared radiation image 10 separately for each line where light beam 8 is at a defined X-coordinate of the coordinate system 9. Load resistors 45 symbolize the discharge time resistances of the pyroelectric picture-elements capacitances, or dwell time.

Figure 2:
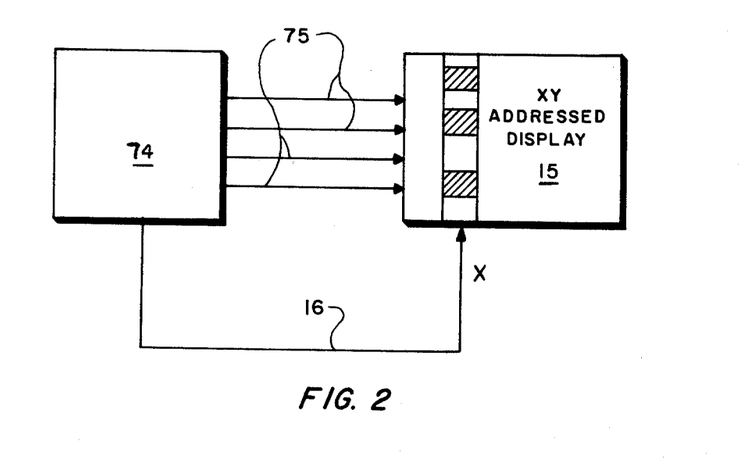
FIG. 2 illustrates one embodiment of the interface between the sensor and the address display of the present invention.

This information that is read out along the parallel output channels 75 may be displayed on a visible radiation display device such as an XY addressed display 15 as shown in FIG. 2. Here the output from sensor electronic amplification means within the pyroelectric imaging system 74 are fed by channels 75 into the proper Y-lines of display 15, and the signal 16, which describes the X-coordinate of the light beam 8 and which may be the signal derived from an angular transducer connected to the mirror 44 of the light beam sweeping means shown in FIG. 7, activates the proper column X of all Y lines in the display. Thus, each picture element 11 of the imager system 74 is displayed in the proper XY position of the XY addressed display 15.

Figure 3:
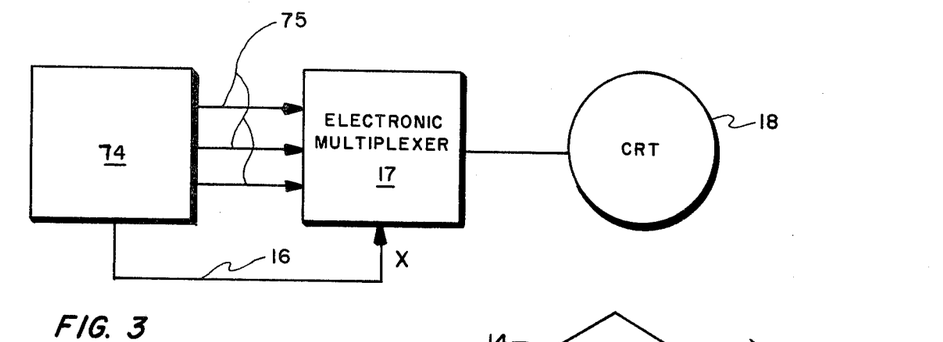
FIG. 3 illustrates a second embodiment of the interface between the sensor and display having a multiplexer therebetween.

FIG. 3 depicts another approach to the display in which the outputs in channels 75 from the electronic amplification means and signal 16 of the X-coordinate derived from the angular transducer are converted by a conventional electronic multiplexer 17 into video that can be displayed by the CRT 18. The signal 16 may also contain clock pulses that are in synchronism with some pickoff position from the sweeping means shown in FIGS. 7, 8, or 9 wherein the clock pulses pulse the Y-columns of the multiplexer 17 for synchronous readout of the multiplexer with the light beam 8 swept across the readout side of the disc 20.

The equivalent circuit of one electrode, or strip line, 40 of the device has to be considered to explain the refinement of the invention to be described below. To simplify the description we have divided each readout channel herein defined with reference to FIG. 4 as comprising the common front electrode 12, the common disc 20, the photoconductive strip 30, and the optically transparent strip 40, into either illuminated or unilluminated picture elements. This definition of each readout channel with reference to FIG. 4 should not be confused with the above noted parallel readout channels on the readout side of disc 20 since functionally both are the same. We define as illuminated picture elements the areas 11 which are exposed to the readout light beam 8 during a dwell time. All other elements which are read out previously or will be read out subsequently to the picture element 11 are defined as unilluminated picture elements. Thus, each strip 40 consists of only one illuminated and a finite number of unilluminated picture elements of size 11 at any particular instant.

Figure 4:
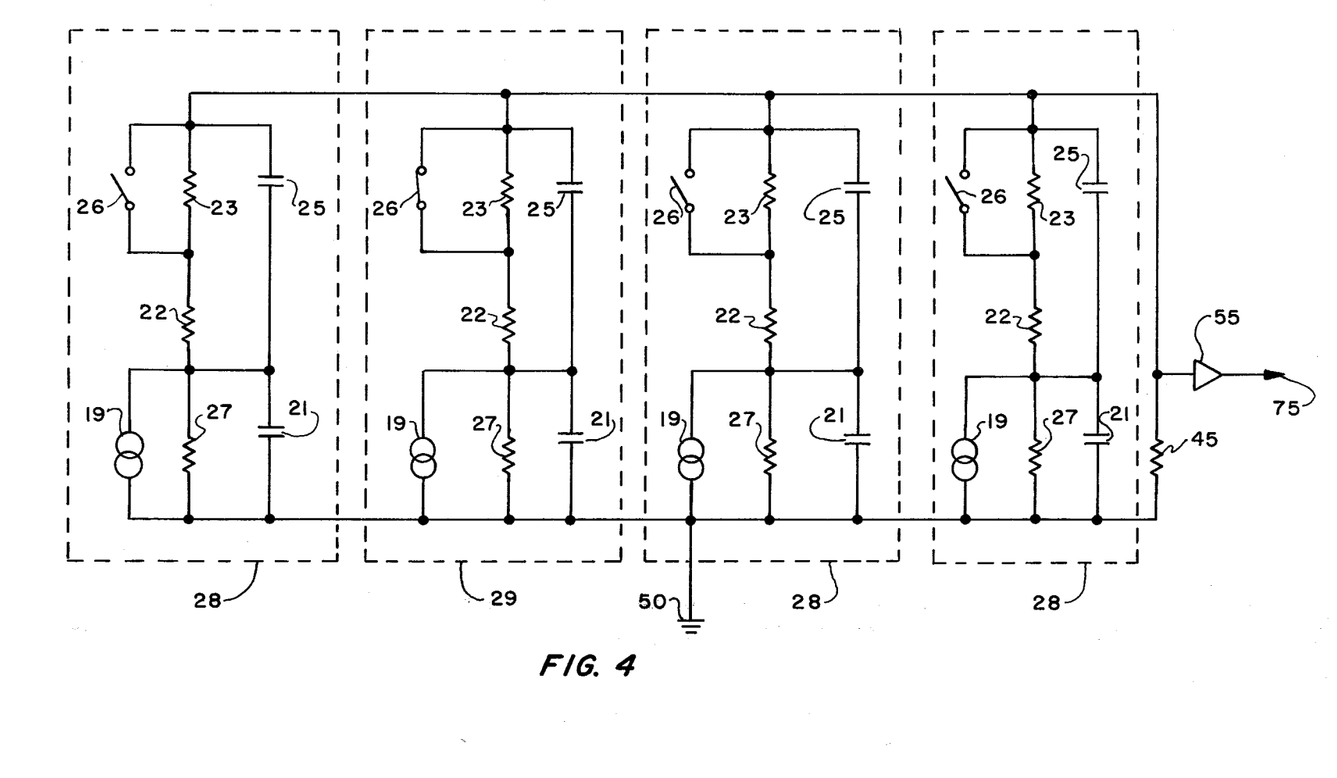
FIG. 4 shows the equivalent circuit of the illuminated and the unilluminated photoconductive elements.

The pyroelectric element that is associated with an illuminated picture element 11 is shown as element 29 in FIG. 4. The current generator 19 represents the pyroelectric current generated by the time-varying signal radiation 10. It is parallel to the capacitor 21 formed by the interface of the front electrode 12 and the pyroelectric material of disc 20 that is under picture element 11. Resistor 27 represents the leakage resistance of the capacitor 21. Resistor 22 is the resistance of the illuminated photoconductive elements and resistor 23 is the resistance of the unilluminated photoconductive elements under the picture element 11. Numeral 25 represents the capacitance of the photoconductive element under picture element 11. The open switches 26 correspond to the unilluminated photoconductive elements 28, while the closed switch 26 symbolizes the illuminated picture element 29. The equivalent circuit in FIG. 4 indicates that the capacitance of 25 has to be minimized, because the signal charge accumulated across capacitor 25 is short circuited during readout, i.e., during closure of switch 26. Furthermore, the ratio of dark resistance 23 to illuminated resistance 22 has to be maximized to minimize the leakage of the signal between readouts and to short-circuit the signal during readout. This ratio determines also the degree to which the signal of the illuminated element 29 is reduced by the loading due to the unilluminated elements 28. The load resistance 45 has to be smaller than resistance 22 to obtain a maximum signal current.

Figures 5, 6:
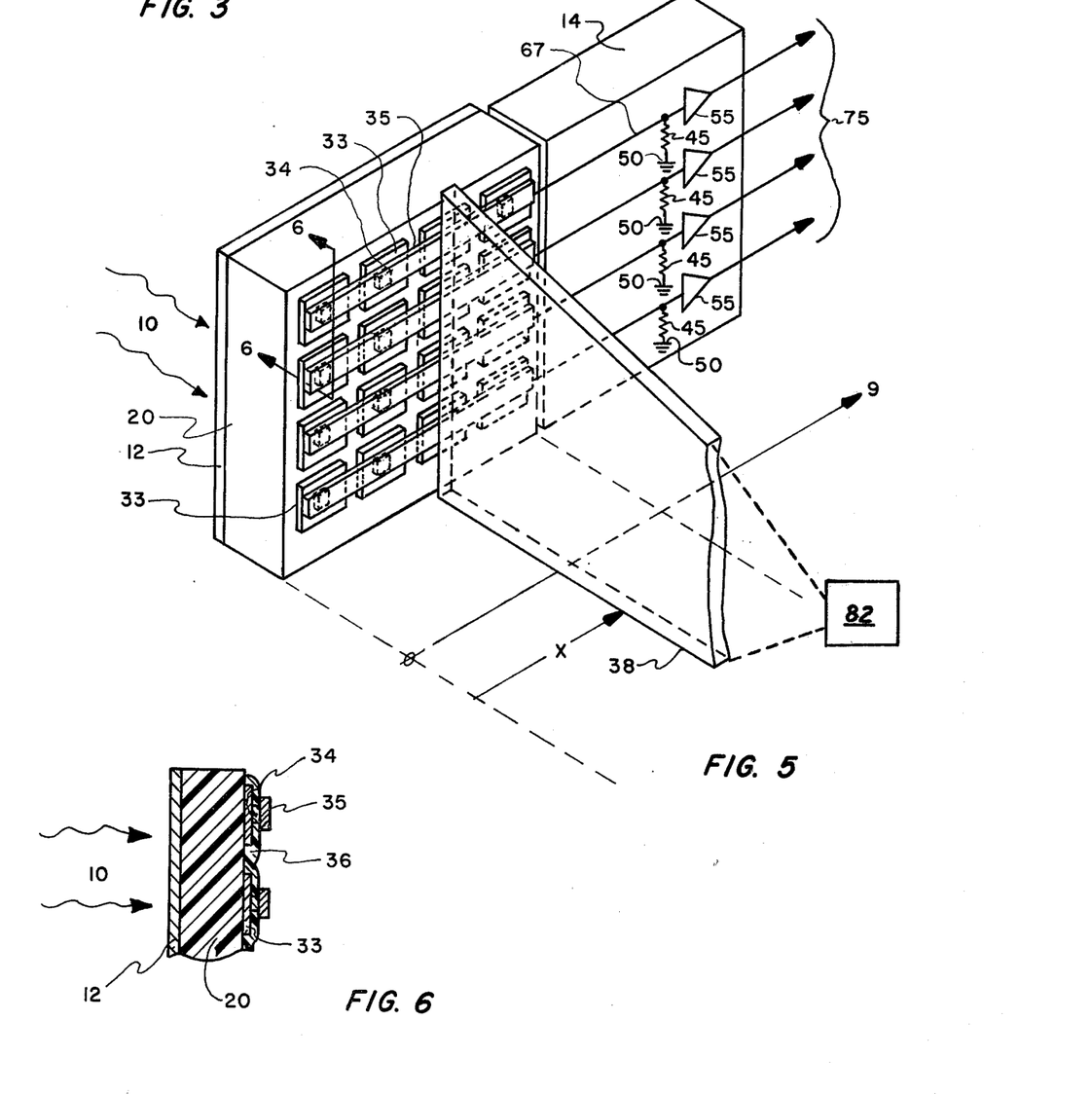
FIG. 5 illustrates in a schematic perspective a second concept of the present invention.
FIG. 6 illustrates a cross-sectional view of the electrodes and conductive strips of FIG. 5.

FIG. 5 shows another embodiment of the pyroelectric solid state imaging system. The readout side of the pyroelectric disc 12 is modified to improve signal readout and to increase the number of picture elements. The readout side of the pyroelectric disc 20 is covered by a mosiac of metal electrodes 33. Each of these metal electrodes 33 represent one discrete picture element. Each electrode 33 carries a small discrete photoconductor 34 thereon that functions as the above mentioned photoconductor switching means for each discrete picture element to electrically connect electrode 33 to an optically transparent strip 35 when the light beam is swept across strip 35. Otherwise, strip 35 is electrically isolated from the metal electrodes 33 by insulating layer 36. Each strip 35 is connected to a load resistance 45 and output electronic amplification means 55 of a particular row. FIG. 6 depicts a cross-section of two adjacent element 33, 34 and 35 from section 6-6 of FIG. 5. In particular, this cross-section shows insulating layer 36, which insulates the metal electrodes 33 from the plurality of optically transparent strips 35 and delineates the dimensions of the photoconductors 34.

The present state-of-the-art allows the construction of the device shown in FIGS. 5 and 6 by conventional photolithographic means. Typical dimensions are: Electrodes 33 are 25$\mu$m $\times$ 25$\mu$m and their center to center spacing is about 30$\mu$m; the diameter of the photoconductors 34, which may consist of properly doped CdSe or CdTe or other thin film semiconductors, is about 5$\mu$m; the thickness of insulating layer 36, such as $SiO_x$, is about 1$\mu$m. The conductive strips 35 may be about 5$\mu$m wide. All metal electrodes 12, 33 and 35 may have a thickness of about 100 Angstroms. The pyroelectric disc 20 supports the total structure and therefore its thickness is primarily determined by the attainable mechanical strength.

The device in FIG. 5 has two major advantages over the device in FIG. 1. For example, the picture elements 33 are geometrically delineated in both dimensions and not as the picture elements 11 in FIG. 1, i.e., only delineated in one dimension geometrically and in the other dimension optically as determined by the width of light beam 8. Consequently, beam 38 of FIG. 5 can flood the small photoconductors 34 within a wide lateral tolerance. The second advantage of the device of FIG. 5 is the reduction of crosstalk between adjacent elements of a given line, i.e., of a given strip 35, because for a given thickness the resistance 23 of the unilluminated photoconductor 34 is much larger than that of a picture element 11 in FIG. 1. Furthermore, the capacitance 25 is substantially reduced because of the much smaller area of 34 assuming a fixed thickness of the photoconductors 30 and 34, respectively. Inspection of FIG. 4 indicates that the increase of the dark resistance 23 and decrease of capacitances 25 will allow the increase of the number of picture elements 28 per line without undue loading of the illuminated picture element 29. In short, the device in FIG. 5 provides a much wider range of design options for picture elements 33 and the corresponding photoconductors 34.

Figure 7:
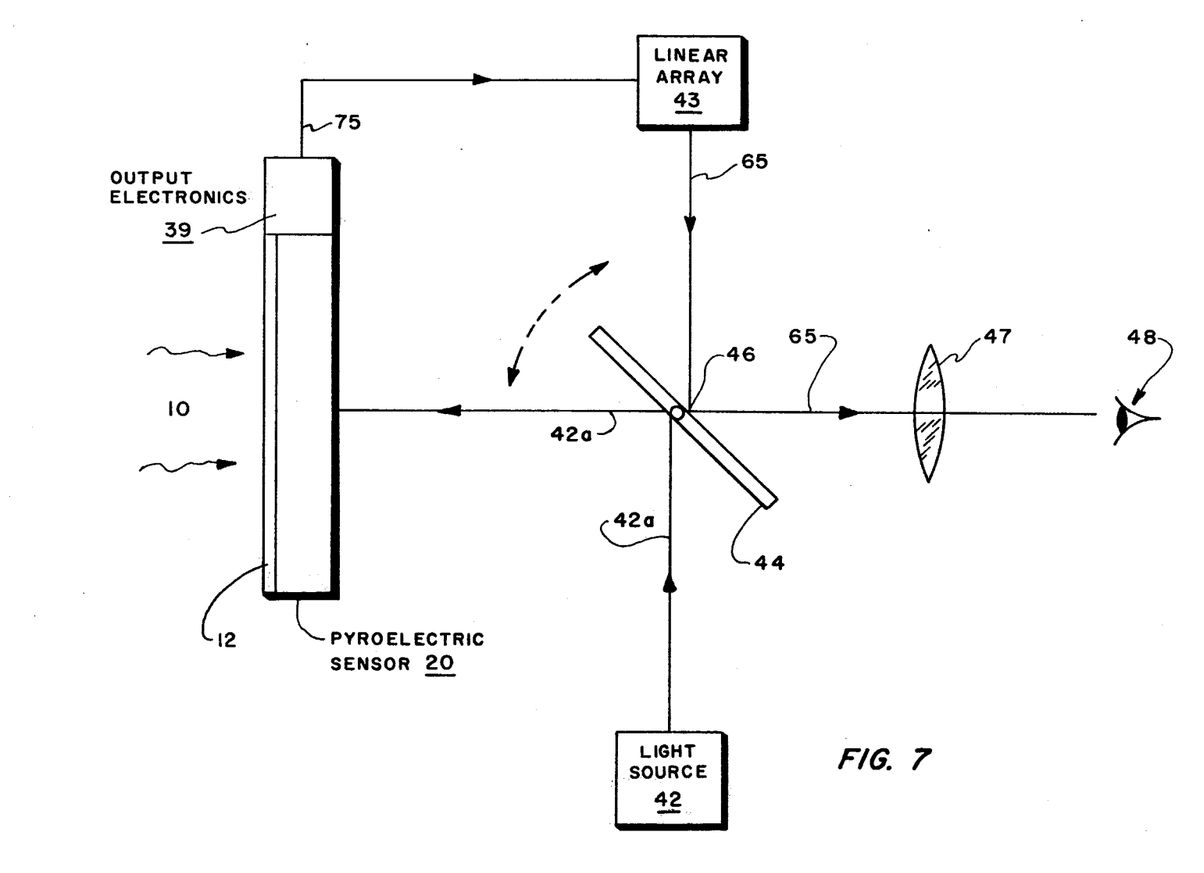
FIG. 7 shows a readout scheme illustrated by the top view of the imager which uses the sensing layer as illustrated in either FIGS. 1 or 5.

FIG. 7 shows a top view of the imaging system of FIG. 5 arranged in a readout scheme having a scanning means. The optically transparent strips 35 of the pyroelectric disc 20 are assumed to be parallel to the plane of the drawing. The scanning means comprises a flat panning mirror 44 that oscillates about its axis 46. Mirror 44 is shown in the top view. The front side of mirror 44 reflects the image of a line source of light 42a, designated as a readout light beam and emitted from light source 42 as a parallel beam over the parallel photoconductor switching means, as represented by photoconductors 34 and strips 35 (not shown) of pyroelectric disc sensor 20. The line source of light 42a is oriented with its length extension parallel to mirror axis 46 and intersects strips 35 the same as light beam 38 of FIG. 5 intersects strips 35. The output electronics 39, which may be fabricated in an integrated or discrete form, is comprised of load resistors 45, video electronics 55, and output pads designated as channels 75. Each pad 75 is connected to one of a plurality of appropriate visible radiators of a visible radiator display device, such as a light emitting diode or a laser, which make up a linear array 43 that is perpendicular to the plane of the drawing. The emitted light beams 65, which are emitted from each of the individual radiators of array 43, are reflected off the back of oscillating mirror 44 across a visual display area for viewing by an observer 48 either directly or through eyepiece 47. As the oscillating mirror scans the readout light beam 42a across the readout side of pyroelectric disc 20, the intensity of the output emitted light beams 65 from array 43 is modulated as a function of the signals provided by the parallel video channels. Since the mirror moves the emitted light beams 65 across the field of view of the observer 48 in synchronism with the motion of the readout light beams 42a, the observer perceives a visible image of the incident infrared signal radiation 10 generated by 20. The process described with reference to FIG. 7 is similar to that used in current infrared scanners. The main difference is that in those scanners the infrared image itself is moved across a linear detector array, while in the present scanning system a stationary infrared image is projected by the radiation 10 incident on the input side of sensor 20. This image does not move and the mirror motion is only used to read out columns of the internally generated signal present on the photoconductor strips. Another approach (not shown) would be to eliminate mirror 44 and to position the readout beam 42a in synchronism with the display beam 65 of array 43 by using electro-optical beam deflectors.

Figure 8:
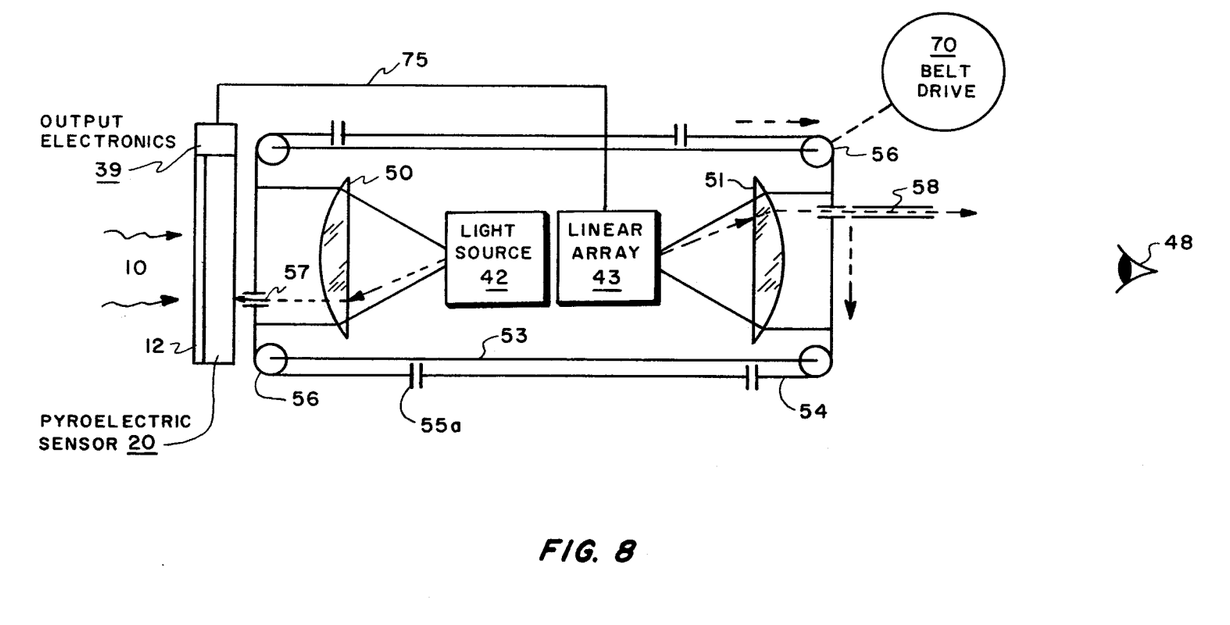
FIG. 8 illustrates a mechanical readout scheme.

Another scanning means for the pyroelectric system is shown in FIG. 8. The light source 42 together with optics 50, which may be cylindrical lens, provide a readout optical means where a parallel readout light beam which is wide enough to cover the entire readout side of disc 20 is swept thereacross. The linear array 43 of light emitting elements are intensity modulated by the signals arriving through channels 75 from output electronics 39. The output of array 43 together with cylindrical lens 51, which is oriented with its cylindrical axis parallel to the length extension of array 43, provide an emitted light optical means where a parallel emitted light beam extends over the full display area. A light scanning means is comprised of an endless belt 54 that is driven by belt drive 70 which is guided by rollers 56. Belt 54, belt drive 70, and rollers 56 are positioned outside an enclosure 53. The endless belt 54 shields disc 20 and the display area facing observer 48 respectively from the light from light source 42 and the light from linear array 43 with the exception that a plurality of slit-shaped openings 55a simultaneously transmit the readout parallel light beam 57 across the photoconductive strips (not shown) for readout of disc 20 and the emitted parallel beam 58 for either presentation on a display device or for direct viewing of the readout information. The plurality of slit-shaped openings 55a are positioned so that one of the openings at the readout position of beam 57, and thus the position of infrared image 10, corresponds to one of the openings at the proper display position of beam 58. Notice that belt 54 must have several corresponding pairs of properly positioned slit-shaped openings 55a to fulfill this readout condition continuously and periodically during movement of belt 54. In particular, after beams 57 and 58 have scanned out one frame, the next pair of corresponding slit openings 55a has to immediately start the readout process anew. Since the sides of the visible image perceived by the observer 48 are reversed in respect to the infrared radiation image absorbed by disc 20, suitable optics either in the infrared radiation path 10 or in the path of the display light beam 58 are needed to off-set this effect. This can also be achieved by more complicated belt drives.

Figure 9:
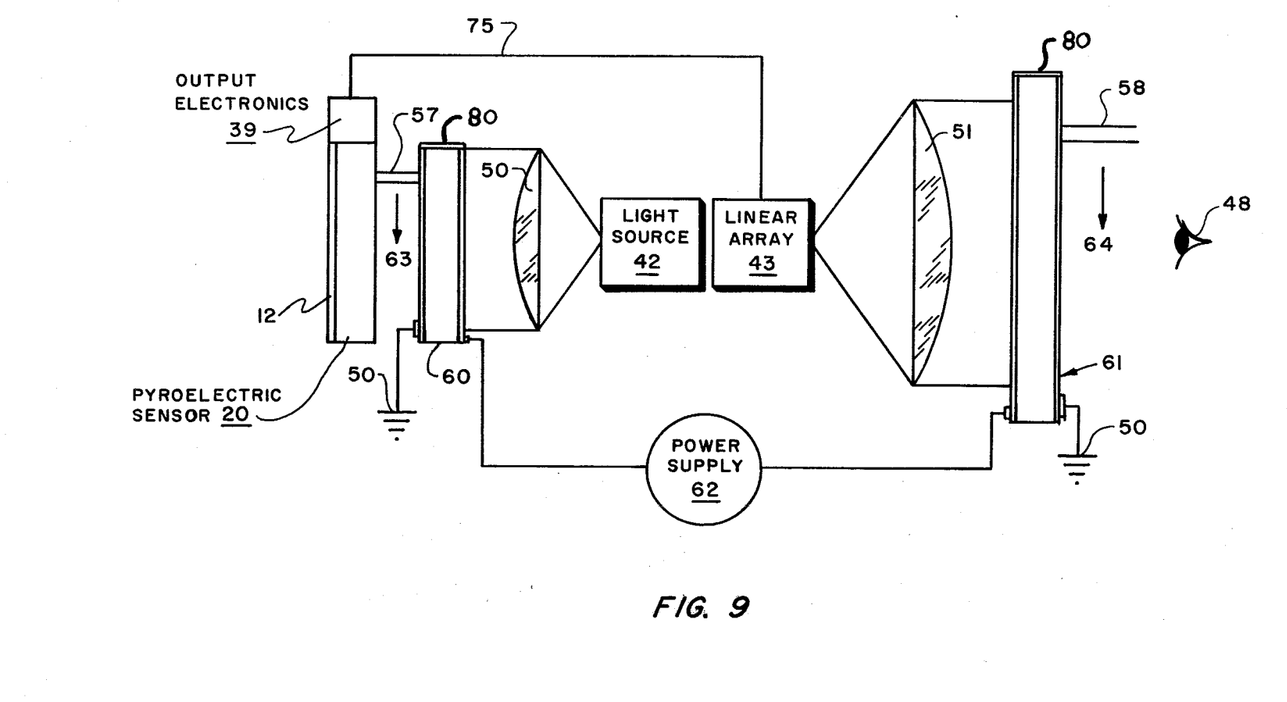
FIG. 9 illustrates a light valve readout scheme.

The light scanning means for sweeping the readout beam 57 and the corresponding display beam 58 may also be swept by light valves 60 and 61 as depicted in FIG. 9. In this embodiment, the belt 54 with its openings 55a therein, the accompanying rollers 56, and enclosure 53 are omitted and are replaced by a readout light valve 60 and a display light valve 61 which are synchronously operated by power supply 62. The light valves transmit the narrow beams 57 and 58 respectively and synchronously move them in the direction shown by arrows 63 and 64. Light valves, based on the Kerr effect or the Pockels effect in KDP, or on a variety of field effects occurring in light crystals and other materials, are suitable for this function. Light valves 60 and 61 may be made of liquid crystals which operate in the dynamic scatter mode, or KDP solid material which needs the polarizers 80 to polarize all of the KDP material except where beams 57 and 58 pass through.

I claim:

1. In a pyroelectric solid state imaging system for producing visible images from infrared radiation signal images, the system comprising:

a thin pyroelectric disc sensing layer means responsive to said infrared radiation signal images, said sensing layer means having an input side and a readout side in which said input side receives said infrared signal radiation images whereby charge patterns are generated in said sensing layer means according to temperature patterns produced by absorption of said infrared radiation signal images;

a plurality of parallel readout channels comprising a plurality of photoconductor switching means contiguous with said readout side of said sensing layer means wherein said plurality of photoconductor switching means activates a plurality of picture elements on said plurality of parallel readout channels; and readout means in cooperation with said plurality of parallel readout channels for presenting a visible image of said infrared radiation signal image in a visual display area, said readout means comprising, a visible radiator display device;

a plurality of output video electronic channels each having an input connected to one of said plurality of parallel readout channels and having outputs therefrom applied to said visible radiator display device; and a light source and scanning means, said light source and scanning means producing a narrow light beam that is orthogonal to said plurality of parallel readout channels in which there is only one illuminated picture element per readout channel at a particular instant and wherein said narrow light beam is swept across said plurality of photoconductor switching means in synchronism with the sweep of said visible radiator display device to provide said visible images in said visual display area.

2. In a pyroelectric solid state imaging system as set forth in claim 1 wherein said visible radiator display device comprises lasers that make up a linear array with said lasers being activated in synchronism with the sweep of said narrow light beam across said plurality of parallel readout channels.

3. In a pyroelectric solid state imaging system as set forth in claim 1 wherein said visible radiator display device is an electronic multiplexer that is synchronized with the sweep of said narrow light beam across said plurality of parallel readout channels and wherein said electronic multiplexer provides video signals therefrom that are displayed on a cathode ray tube.

4. In a pyroelectric solid state imaging system as set forth in claim 1 wherein said plurality of photoconductor switching means are comprised of parallel continuous photoconductive strips that are contiguous with said readout side of said thin pyroelectric disc and a plurality of optically transparent electrically conductive readout strips deposited thereon.

5. In a pyroelectric solid state imaging system as set forth in claim 1 wherein said visible radiator display device is a linear array of light emitting diodes with each line of said linear array of light emitting diodes connected to one channel of said plurality of parallel readout channels and each column of said linear array of light emitting diodes is activated in synchronism with the sweep of said narrow light beam across said plurality of parallel readout channels.

6. In a pyroelectric solid state imaging system as set forth in claim 5 wherein said plurality of photoconductor switching means comprise:

a mosaic of metal electrodes contiguous with said readout side of said thin pyroelectric disc; and a plurality of discrete photoconductors deposited on said mosaic of metal electrodes wherein said plurality of optically transparent electrically conductive readout strips are deposited over all of said plurality of discrete photoconductors that are in each channel of said plurality of parallel readout channels but are otherwise electrically insulated from said mosaic of metal electrodes whereby said plurality of picture elements are delineated by the geometrical dimensions of said mosaic of metal electrodes.

7. In a pyroelectric solid state imaging system as set forth in claim 6 wherein said input side of said sensing layer means comprises an infrared transmissive electrode covered by an infrared absorber.

8. In an optical readout means for activation and display of a pyroelectric solid state imaging system which comprises a pyroelectric disc having an input side that has an infrared image incident thereon and a readout side having a plurality of parallel photoconductor switching means forming a plurality of picture elements into a plurality of readout channels that are connected by electronic amplification means to a visible radiator display device that produces an emitted light beam therefrom when a parallel readout light beam from a light source is scanned across said plurality of readout channels, the readout means comprising:

a scanning means for simultaneously scanning said readout light beam into a parallel light beam over said photoconductor switching means and scanning a visible image of said emitted light beams from said visible radiator display device across a visual display area whereby readout of said infrared image from said pyroelectric disc is provided by the time-varying incidence of said readout light beam on said photoconductors switching means cooperating with said plurality of picture elements and presents a time-varying generated charge pattern output signal from said pyroelectric disc along said plurality of readout channels to said visible radiator display device.

9. In an optical readout means as set forth in claim 8 wherein said scanning means comprises a flat oscillating mirror having a front side that scans said readout light beam from said light source across said plurality of parallel photoconductor switching means and a back side that scans said emitted light beam from said visible radiator display device across said visual display area.

10. In an optical readout means as set forth in claim 8 wherein said scanning means comprises:

a readout optical means that causes said parallel readout light beam to cover the entire readout side of said pyroelectric disc when said parallel readout light beam is scanned thereacross;

an emitted light optical means that causes said emitted light beam from said visible radiator display device to extend over the full view of said visual display area when said emitted light beam is scanned; and a light scanning means for periodically and continuously scanning said parallel readout light beam across the readout side of said pyroelectric disc simultaneously with scanning of said emitted light beam over said visual display area whereby said infrared radiation signal image is reproduced as a visible image in said visual display area.

11. In an optical readout means as set forth in claim 10 wherein said light scanning means comprises:

a readout light valve having a power supply connected thereacross; and a display light valve having said power supply connected thereacross wherein said power supply operates said readout light valve with said display light valve synchronously wherein said parallel readout light beam and said parallel emitted light beam are simultaneously and periodically scanned over the entire readout side of said sensing layer means and over the entire area of said visual display area to continuously and periodically complete one frame at a time.

12. In an optical readout means as set forth in claim 10 wherein both of said readout optical means and said emitted light optical means comprise cylindrical lens that respectively provide a parallel readout light beam and a parallel emitted light beam.

13. In an optical readout means as set forth in claim 12 wherein said light scanning means comprises an endless driven belt having a plurality of slit-shaped openings therein and enclosed in a housing wherein said endless driven belt shields said readout side of said sensing layer means from said readout light beam except for transmission of said parallel readout light beam through one of said plurality of slit-shaped openings simultaneously across said plurality of readout channels and wherein said endless belt further shields said visual display area except for transmission of a parallel emitted light beam emitted from said visible radiator display device through one of said plurality of slit-shaped openings whereby said parallel readout light beam and said parallel emitted light beam are simultaneously and periodically scanned over the entire readout side of said sensing layer means and over the entire area of said visual display area to continuously and periodically complete one frame at a time.

14. In an optical readout means as set forth in claim 12 wherein said readout light valve and said display light valve are liquid crystals.

15. In an optical readout means as set forth in claim 12 wherein said readout light valve and said display light valve are made of KDP solid material.

* * * * *